United States Patent
Kapinos et al.

(10) Patent No.: US 11,540,402 B2
(45) Date of Patent: Dec. 27, 2022

(54) ADJUSTABLE COMPUTING DEVICE HANGER

(71) Applicant: Lenovo (Singapore) Pte. Ltd., Singapore (SG)

(72) Inventors: Robert James Kapinos, Durham, NC (US); Scott Wentao Li, Cary, NC (US); Robert James Norton, Jr., Raleigh, NC (US); Russell Speight Vanblon, Raleigh, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 17/220,916

(22) Filed: Apr. 1, 2021

(65) Prior Publication Data
US 2022/0322545 A1  Oct. 6, 2022

(51) Int. Cl.
H05K 5/02 (2006.01)
G06F 1/16 (2006.01)
H05K 7/18 (2006.01)

(52) U.S. Cl.
CPC ......... *H05K 5/0204* (2013.01); *G06F 1/1615* (2013.01); *G06F 1/1681* (2013.01); *H05K 5/0226* (2013.01); *H05K 7/18* (2013.01)

(58) Field of Classification Search
CPC ...... H05K 5/0204; H05K 5/0226; H05K 7/18; G06F 1/1615; G06F 1/1681
See application file for complete search history.

(56) References Cited

U.S. PATENT DOCUMENTS

| | | | | |
|---|---|---|---|---|
| 5,480,075 A | * | 1/1996 | Robinson | A47G 25/16 211/115 |
| 7,828,179 B2 | * | 11/2010 | Sprovieri | A47G 25/4023 223/94 |
| 9,404,615 B1 | * | 8/2016 | Gonzalez | F16M 11/041 |
| 9,468,326 B2 | * | 10/2016 | Yip | A47G 25/50 |
| 9,889,910 B2 | * | 2/2018 | Zimmerman | B63B 59/02 |
| 10,292,883 B2 | * | 5/2019 | Jepsen | A61G 13/101 |
| 10,349,760 B2 | * | 7/2019 | Peake | A47G 1/166 |
| 10,517,416 B1 | * | 12/2019 | Petren | A47F 7/24 |
| 10,815,628 B2 | * | 10/2020 | Jackson | E01D 21/00 |
| 10,834,838 B1 | * | 11/2020 | Ross | H05K 7/18 |
| 11,225,380 B2 | * | 1/2022 | Czapp | B65G 17/123 |
| 2003/0130010 A1 | * | 7/2003 | Monroe | H05K 5/0204 455/560 |
| 2017/0048992 A1 | * | 2/2017 | Katsaros | H05K 7/1489 |
| 2018/0350277 A1 | * | 12/2018 | Entwistle | F16M 13/022 |
| 2020/0156238 A1 | * | 5/2020 | Peng | B25J 15/0226 |
| 2021/0247018 A1 | * | 8/2021 | Yamada | H05K 5/0204 |

(Continued)

*Primary Examiner* — Rockshana D Chowdhury
*Assistant Examiner* — Douglas R Burtner
(74) *Attorney, Agent, or Firm* — Brian J. Pangrle

(57) ABSTRACT

An adjustable computing device hanger can include a hangable support member; a first set of angling side members, pivotably coupled to the hangable support member, that include first side edge bumpers, and a second set of angling side members, pivotably coupled to the hangable support member, that include second side edge bumpers; and a first guide member that bridges the first set of the angling side members and a second guide member that bridges the second set of angling side members, where each of the first guide member and the second guide member includes a corresponding bottom edge bumper.

20 Claims, 11 Drawing Sheets

(56) References Cited

U.S. PATENT DOCUMENTS

2022/0136245 A1\* 5/2022 Nelson .................... E04B 9/183
                                                          52/506.07
2022/0162859 A1\* 5/2022 Abel ................... E04F 13/0883

\* cited by examiner

ADJUSTABLE COMPUTING DEVICE HANGER

TECHNICAL FIELD

Subject matter disclosed herein generally relates to hangers and computing and display devices.

BACKGROUND

A device can include a housing and a display or housings coupled via one or more hinge assemblies where one or more of the housings can include a display.

SUMMARY

An adjustable computing device hanger can include a hangable support member; a first set of angling side members, pivotably coupled to the hangable support member, that include first side edge bumpers, and a second set of angling side members, pivotably coupled to the hangable support member, that include second side edge bumpers; and a first guide member that bridges the first set of the angling side members and a second guide member that bridges the second set of angling side members, where each of the first guide member and the second guide member includes a corresponding bottom edge bumper. Various other apparatuses, assemblies, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
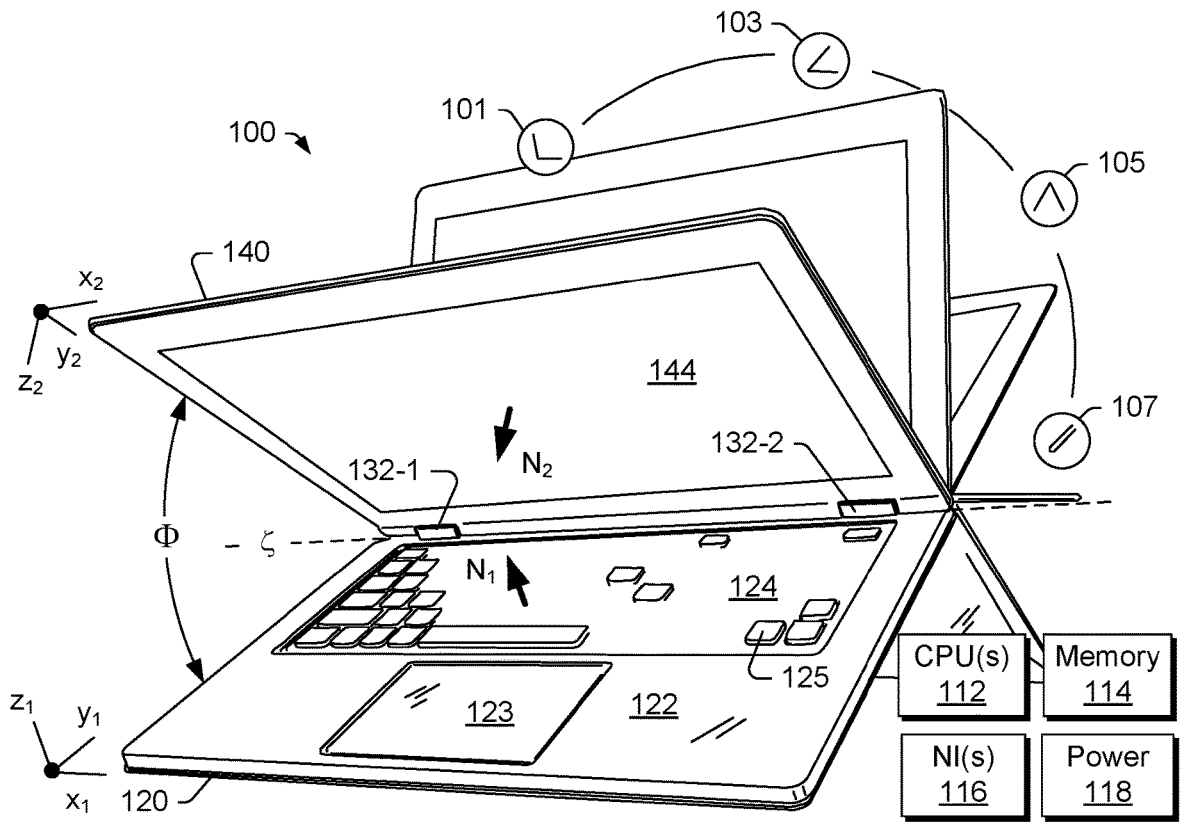
FIG. 1 is a series of diagrams of examples of devices.
Figure 1:
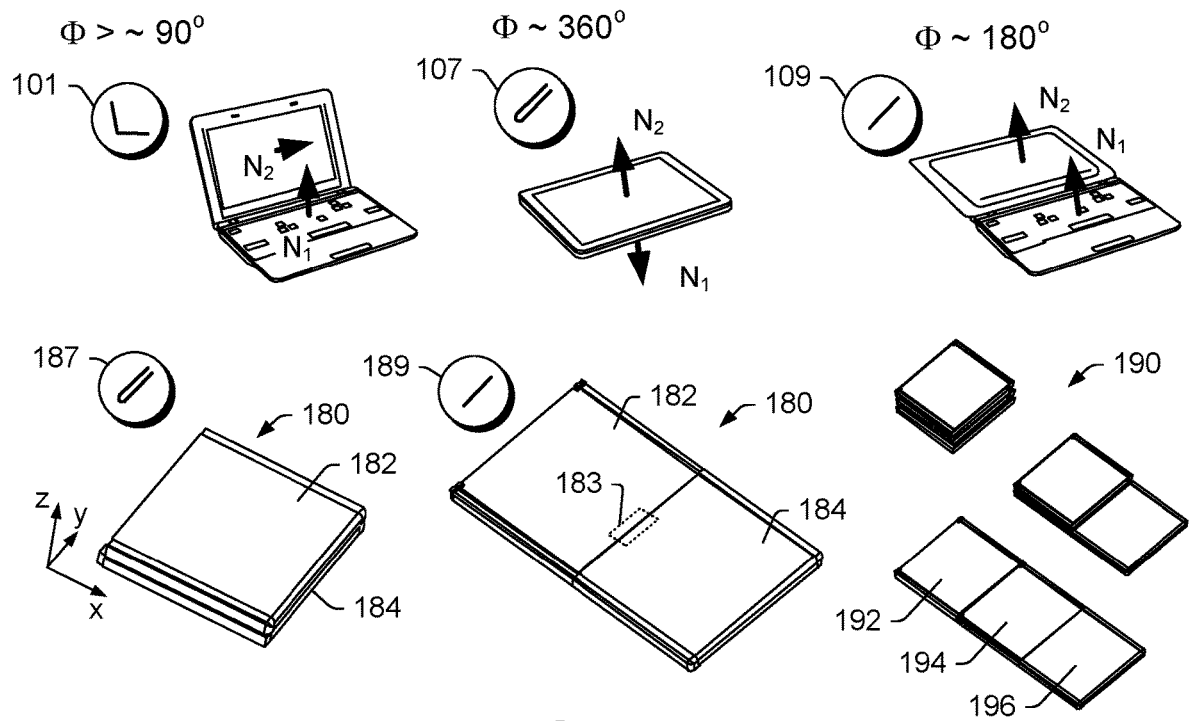

FIG. 1 shows an example of a system 100 that includes a keyboard housing 120 and a display housing 140 that are pivotable with respect to each other via movement about one or more hinges 132-1 and 132-2 (e.g., hinge assemblies). FIG. 1 also shows an example of a system 180 that includes a first housing 182 and a second housing 184 that are pivotable with respect to each other via movement about one or more hinges 183 and an example of a system 190 that includes a first housing 192, a second housing 194 and a third housing 196 that may be pivotable with respect to each other via movement about hinges.

As an example, the system 100, the system 180 and/or the system 190 may include one or more processors 112, memory 114 (e.g., one or more memory devices), one or more network interfaces 116, and one or more power cells 118. Such components may be, for example, housed with the keyboard housing 120, the display housing 140, the keyboard housing 120 and the display housing 140, the housing 182, the housing 184, the housing 182 and the housing 184, one or more of the housings 192, 194 and 196, etc.

As shown in the example of FIG. 1, the keyboard housing 120 includes a keyboard 124 with keys 125 and the display housing 140 includes a display 144. In such an example, the keyboard 124 is defined in a first Cartesian coordinate system as having a width along an x-axis ($x_1$), a length along a y-axis ($y_1$) and a height along a z-axis ($z_1$) that extends in a direction outwardly away from touch surfaces of keys 125 of the keyboard 124 and the display 144 is defined in a second Cartesian coordinate system as having a width along an x-axis ($x_2$), a length along a y-axis ($y_2$) and a height along a z-axis ($z_2$) that extends in a direction outwardly away from a viewing surface of the display 144.

As shown in the example of FIG. 1, the one or more hinges 132-1 and 132-2 pivotably connect the keyboard housing 120 and the display housing 140 for orienting the display housing 140 with respect to the keyboard housing 120. For example, orientations may include orientations definable with respect to an axis (e.g., or axes) such as the axis ζ and an angle Φ about that axis.

FIG. 1 shows some examples of orientations 101, 103, 105, 107 and 109. The orientation 101 may be a notebook orientation where the angle Φ is about 90 degrees or more (e.g., or optionally somewhat less than about 90 degrees depending on position of a user, etc.). As shown, for the orientation 101, a user may use a finger or fingers of one or both hands to depress keys 125 of the keyboard 124 (e.g., touch typing), for example, while viewing information being rendered to the display 144 of the display housing 140 (e.g., using the one or more processors 112, the memory 114, etc. that may be included in the keyboard housing 120, the display housing 140 or both). As an example, the keyboard housing 120 may include a frontal surface 122 and may include a touch input surface 123 (e.g., of a touch input device such as a touchpad). As an example, the keyboard 124 may include one or more other input devices (e.g., a control stick, etc.).

As to the orientation 103, it may correspond to a display orientation for viewing the display 144 where the keyboard 124 faces downward and the system 100 is supported by the keyboard housing 120 (e.g., by a rim about the keyboard 124, the frontal surface 122, etc.). As to the orientation 105, it may correspond to a "tent" orientation where the display 144 faces outwardly for viewing on one side of the tent and the keyboard 124 of the keyboard housing 120 faces outwardly on the other side of the tent.

The orientation 107 may be a tablet orientation where the angle Φ is about 360 degrees such that a normal outward vector $N_1$ of the keyboard 124 of the keyboard housing 120 and a normal outward vector $N_2$ of the display 144 of the display housing 140 are oriented in oppositely pointing directions, pointing away from each other; whereas, in contrast, for a closed orientation of the system 100 (e.g., where the angle Φ is about 0 degrees), the vectors $N_1$ and $N_2$ would be pointing toward each other.

The orientation 109 may be a planar orientation where the angle Φ is about 180 degrees such that a normal outward vector $N_1$ of the keyboard 124 of the keyboard housing 120 and a normal outward vector $N_2$ of the display 144 of the display housing 140 are oriented in approximately the same pointing directions.

As shown in FIG. 1, the system 180 can include a folded orientation 187 and a planar orientation 189. As an example, one or both of the housings 182 and 184 may include a display. For example, the housing 182 can be a first housing with a first display and the housing 184 can be a second housing with a second display.

As shown in FIG. 1, the system 190 can include various orientations, including, for example, a planar orientation of the three housings, a partially folded orientation and a folded orientation. As an example, a three housing system may be configurable in more than one folded orientation with respect to a "middle" housing. For example, the housings 192 and 196 may be folded with respect to the housing 194 with the housing 192 on the top side or bottom side or with the housing 196 on the top side or bottom side.

Figure 2:
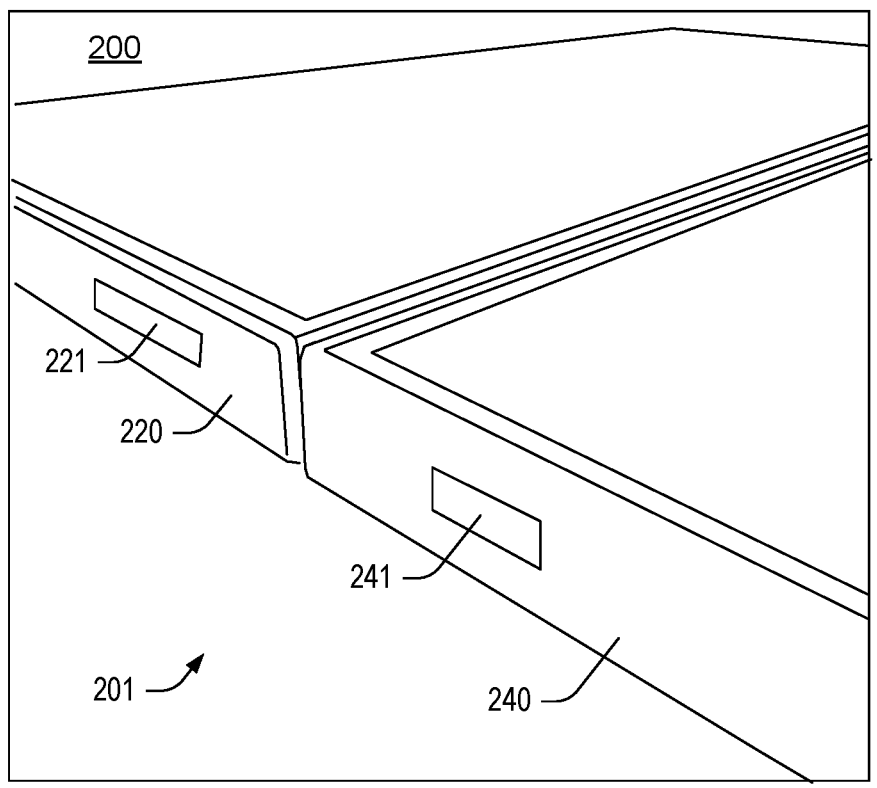
FIG. 2 is a perspective view of an example of a device that includes at least one retractable hinge assembly.
Figure 2:
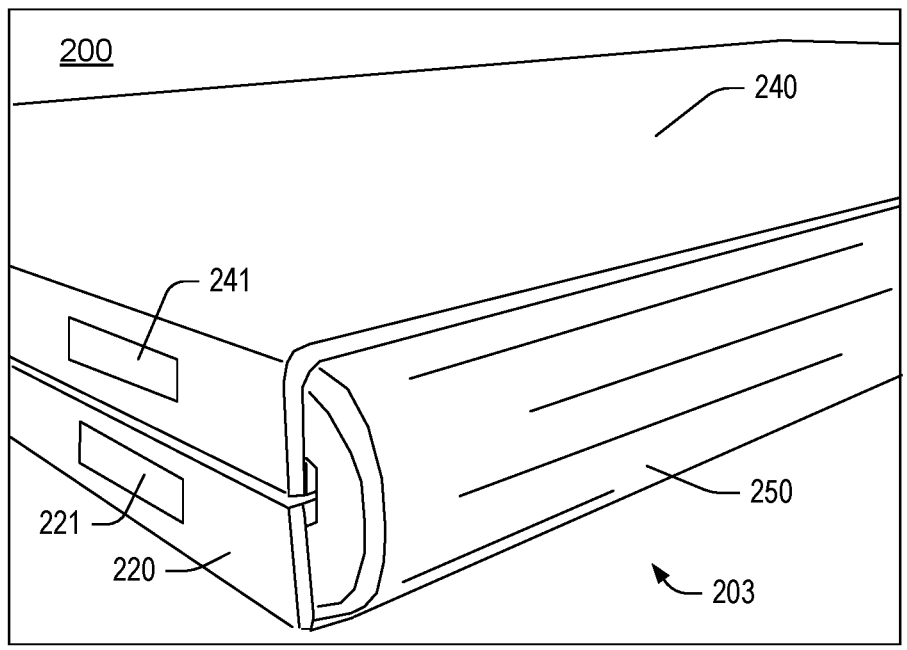

FIG. 2 show perspective views of an example of a device 200 with two housings 220 and 240 in a flat orientation 201 and in a folded orientation 203 where, for example, the device 200 can include a retractable hinge assembly 250 such that the housings 220 and 240 can be in contact or close proximity in the flat orientation 201.

In the example of FIG. 2, the device 200 can include the housing 220 as a first housing that includes a first display and a first recess; the housing 240 as a second housing that includes a second display and a second recess; and one or more of the retractable hinge assemblies 250 where, in a planar orientation of the first housing 220 and the second housing 240, the one or more retractable hinge assemblies 250 are retracted in part in the first recess of the first housing 220 and/or in part in the second recess of the second housing 240.

In the example of FIG. 2, examples of ports 221 and 241 are shown, which may be one or more types of ports (e.g., USB, memory card, power, etc.). As shown, the ports 221 and 241 can be at a fixed location along an edge (e.g., a side edge) of a housing. The device 200 of FIG. 2 may include one or more features of the device 100, the device 180 and/or the device 190 of FIG. 1.

As explained, computing devices can have various form factors, various arrangements of housing, various arrangements of hinges, etc. As to clamshell computing device, people often want to use such a clamshell device in areas that do not have room to rest the device or rest it with some assurances of stability. As an example, an adjustable computing device hanger can provide a user with one or more ways to rest a clamshell computing device and/or one or more other computing devices. Such a hanger may be hung on a wall, a door, or another structure. As such a hanger is adjustable, it may be utilized to hang a computing device in one or more orientations and/or to hang different sized computing devices, which may provide the hanger with flexibility (e.g., consider a range from 8 inch laptops to 24 inch laptops, etc.). As explained, various computing devices may fold or open to be relatively flat. As an example, an adjustable computing device hanger can hang a computing device when it is in a relatively flat orientation.

As an example, an adjustable computing device hanger may utilize a pantograph type of arrangement of members and pivot joints that can allow for adjustments to fit a range of computing device, optionally in more than one orientation.

As an example, a hanger can include a central vertical spine that provides a point to hang it and attach two arms on each side. In such an example, the arms on each side can be coupled to legs that run parallel to the spine attached to them. In such an example, attachment points can be pivotable so that the legs can move up and down freely by swinging the arms. As an example, an arm may end with a clamp, for example, to clamp an edge of a computing device. In various examples, arms can be coupled to vertical legs where each of the vertical legs includes a hook, for example, for a bottom edge of a computing device to rest on. As to arm end clamps, each clamp may be pivotably pinned so it can adjust to be vertical regardless of the attitude of the arms. As an example, the weight of a computing device pressing down on hooks at leg ends can cause arm end clamps to press onto the edges of the computing device.

As an example, a clamp may be beveled and springy so it can self-adjust to different thicknesses and, as mentioned, a clamp may be pivotable (e.g., rotatable about a pin, a joint, etc.) such that it may track a side edge of a computing device.

As an example, a spine can include a sliding clamp that can be slide into position to secure a top edge of a computing device.

As to sizes of laptops (e.g., clamshell computing devices), a hanger may be suitable for use with 12 inch, 14 inch and 17 inch models (or smaller or larger models).

As an example, a hanger can include a frame with a trapezoidal mechanism that adjusts to fit a plurality of sizes of computing devices where the weight of the computing device helps to clamp the computing device into the hanger. In such an approach, the hanger and computing device as an assembly can be hung on a wall or stand during use.

As an example, a hanger can include one or more of adjustable depth bottom hooks to fit different thickness computing devices, one or more mechanically adjustable depth side hooks, one or more side hooks with adjustable port cutouts, one or more removable side hooks to go into one arm mode (e.g., consider using less than all arm ends to engage a computing device), one or more height adjustable arms to keep side ports clear of obstruction, one or more different kinds of sliders for a top securing mechanism, or a latch, a top spin with a hook or a hole in it, upper and lower arm ends joined by one long clamp (e.g., rather than separate smaller ones, etc.), a spacer mechanism at a top and at sides to handle computing device that may not lay perfectly flat, a soft surface on one side and clamps for damage protection, one or more adjustable length arms to make a frame more compact when not in use and/or when used with smaller computing devices and, for example, an extensible spine for use with large computing devices.

Figure 3:
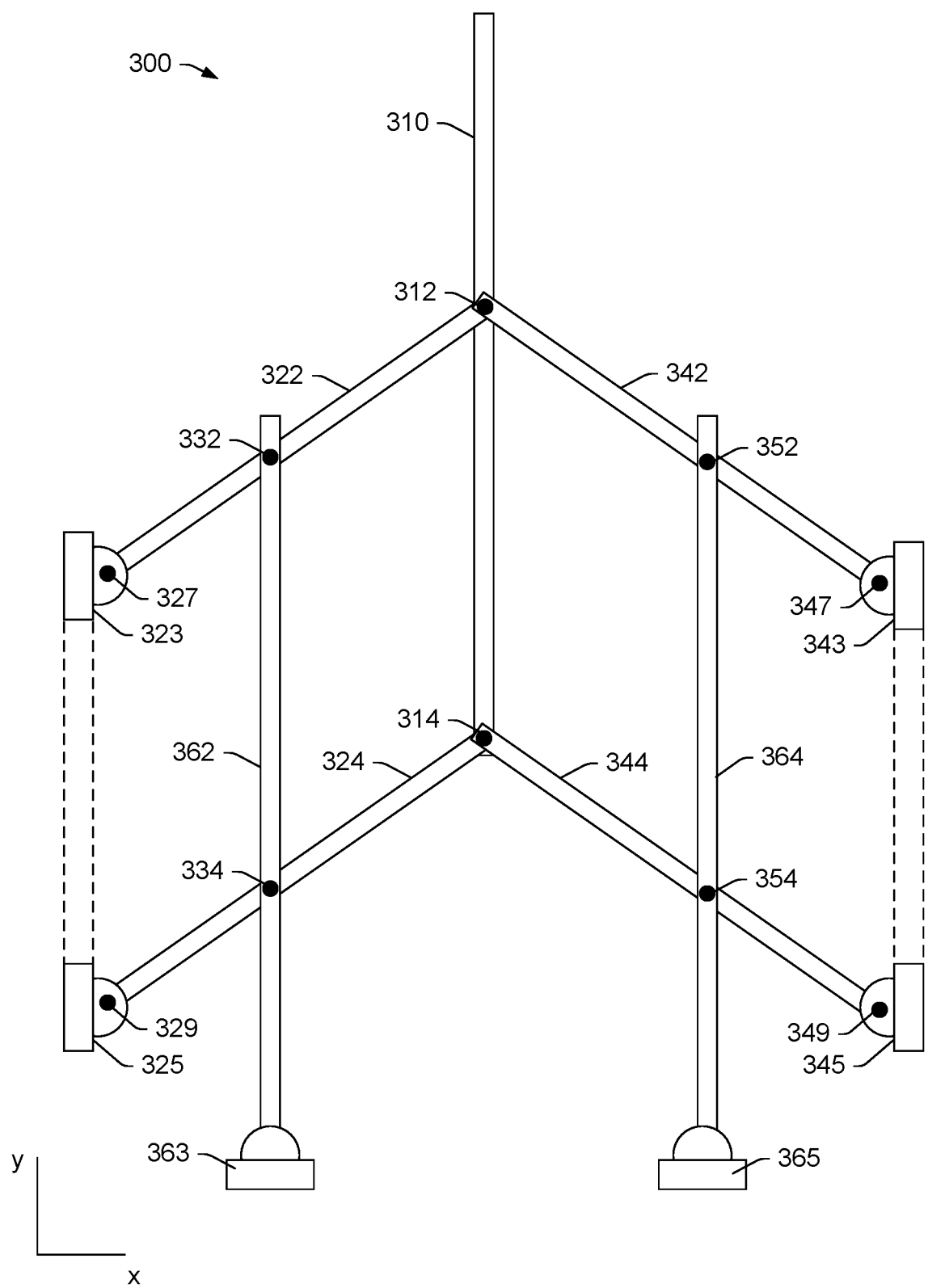
FIG. 3 is a diagram of an example of an adjustable computing device hanger.

FIG. 3 shows an adjustable computing device hanger 300 that includes a hangable support member 310, a first set of angling side members 322 and 324, pivotably coupled to the hangable support member 310, that include first side edge bumpers 323 and 325, and a second set of angling side members 342 and 344, pivotably coupled to the hangable support member 310, that include second side edge bumpers 343 and 345; and a first guide member 362 that bridges the first set of the angling side members 322 and 324 and a second guide member 364 that bridges the second set of angling side members 342 and 344, where each of the first guide member 362 and the second guide member 364 include a corresponding bottom edge bumper 363 and 365, respectively. In the example of FIG. 3, pivot joints 312, 314, 327, 329, 332, 334, 347, 349, 352 and 354 are shown. As an example, the pivot joints 312 and 314 may be pairs, for example, a first pair for the members 322 and 342 and a second pair for the members 324 and 344. In the example of FIG. 3, the bumpers 323, 325, 343 and 345 can be pivotable as they may be utilized in a substantially vertical orientation when a computing device is hung using the hanger 300; noting that the bumpers 363 and 365 may be fixed as they can be utilized in a substantially horizontal orientation when a computing device is hung using the hanger 300.

In the example of FIG. 3, one or more features of the hanger 300 may be described with respect to a coordinate system such as, for example, a Cartesian coordinate system with x, y, and z coordinates. As an example, the member 310 may be utilized to define a symmetry axis or a symmetry plane. In various examples, operation of the hanger 300 may be substantially symmetric about such a symmetry axis or symmetry plane. For example, various members of the hanger 300, bumpers of the hanger 300, etc., may move in similar but mirrored manners with respect to the member 310.

As an example, an adjustable computing device hanger may be described as including a hangable spine (see, e.g., the member 310); left arms (see, e.g., the members 322 and 324), pivotably coupled to the hangable spine, that include left side clamps (see, e.g., the bumpers 323 and 325), and right arms (see, e.g., the members 342 and 344), pivotably coupled to the hangable spine, that include right side clamps (see, e.g., the bumpers 343 and 345); and a left leg (see, e.g., the member 362) that bridges the left arms and a right leg (see, e.g., the member 364) that bridges the right arms, where each of the left leg and the right leg includes a corresponding hook (see, e.g., the bumpers 363 and 365).

As shown in FIG. 3, via dashed lines, the bumpers 323 and 325 may be part of a long continuous bumper and/or the bumpers 343 and 345 may be part of a long continuous bumper. As an example, a bumper may include one or more openings. For example, a computing device may include one or more side ports where a side port can be accessible via an opening of a bumper.

Figure 4:
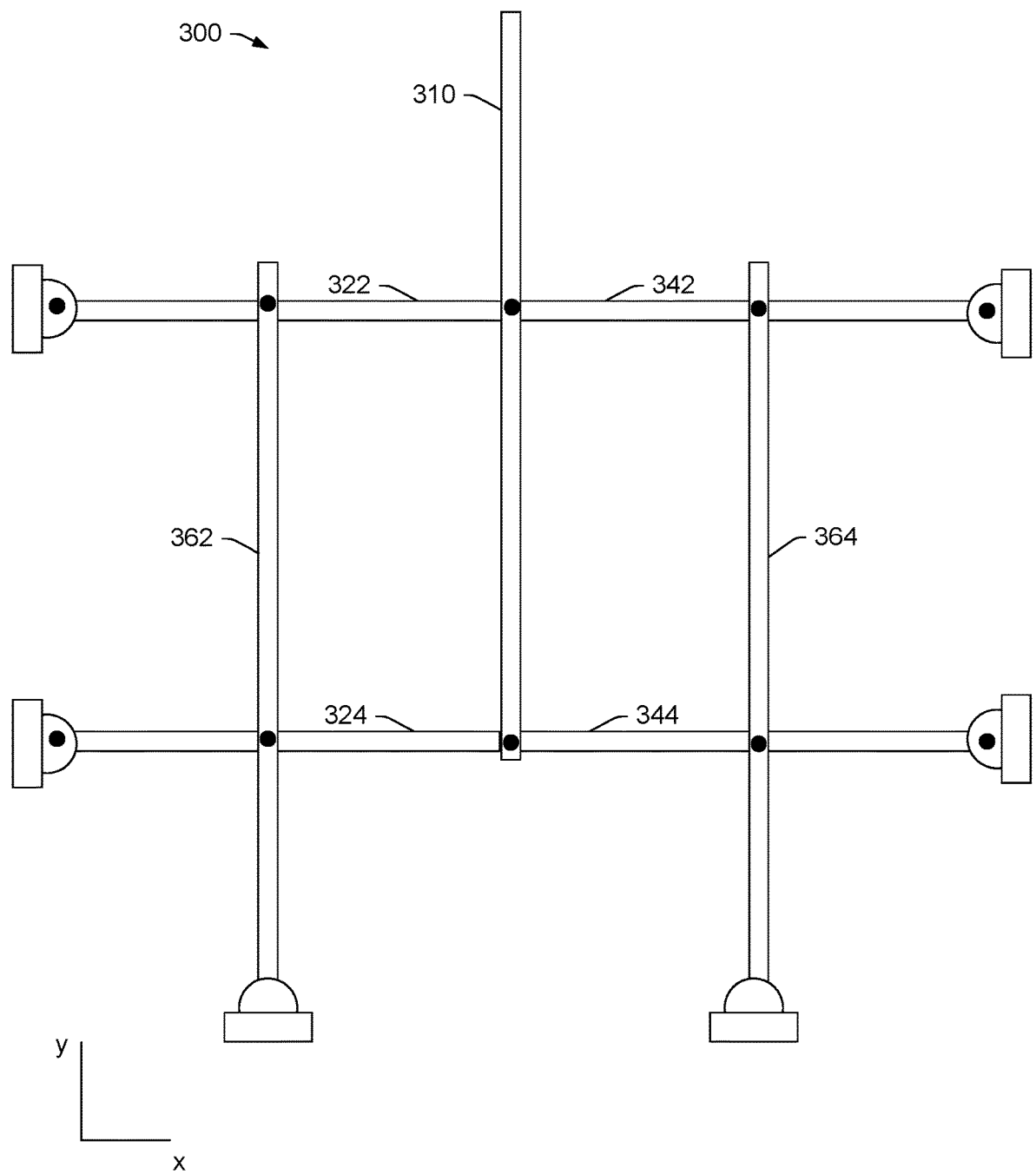
FIG. 4 is a diagram of an example of an adjustable computing device hanger.

FIG. 4 shows the hanger 300 in a maximum width orientation where the members 322 and 324 are substantially parallel and horizontal and where the members 342 and 344 are substantially parallel and horizontal. In the examples of FIG. 3 and FIG. 4, the members 310, 362 and 364 remain substantially parallel and vertical. As an example, the hanger 300 may include a limiter that does not allow the hanger 300 to move beyond the orientation of FIG. 4 (e.g., where the member 310 would move downwardly while the members 362 and 364 move upwardly).

Figure 5:
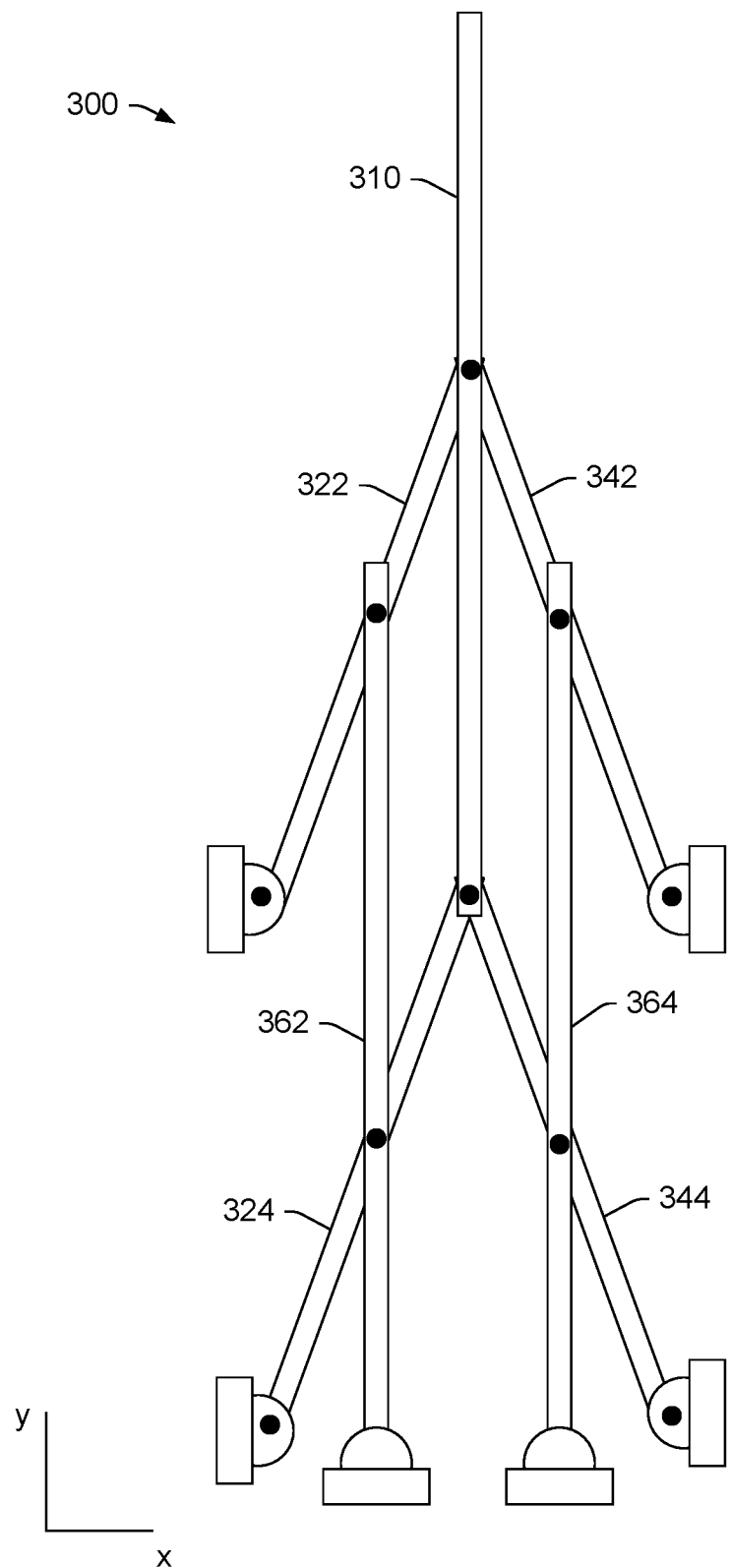
FIG. 5 is a diagram of an example of an adjustable computing device hanger.

FIG. 5 shows the hanger 300 in an orientation that is at or near a minimum width (e.g., a minimum width orientation) where the members 322 and 324 are angled steeply downwardly and where the members 342 and 344 are angled steeply downwardly. In the examples of FIG. 3, FIG. 4 and FIG. 5, the members 310, 362 and 364 remain substantially parallel and vertical. As an example, the hanger 300 may include a limiter that does not allow the hanger 300 to move beyond the orientation of FIG. 5 (e.g., where the member 310 would move upwardly while the members 362 and 364 move downwardly) or, for example, the hanger 300 may move to a minimum width orientation where the members 310, 362 and 364 contact (e.g., become adjacent).

FIG. 6A, FIG. 6B, FIG. 6C and FIG. 6D show the hanger 300 with respect to the device 100, the device 180, the device 190 and/or the device 200 in various arrangements, which may be of different sizes of the hanger 300 and/or different sizes of the device 100, the device 180, the device 190 and the device 200.

Figure 6A:
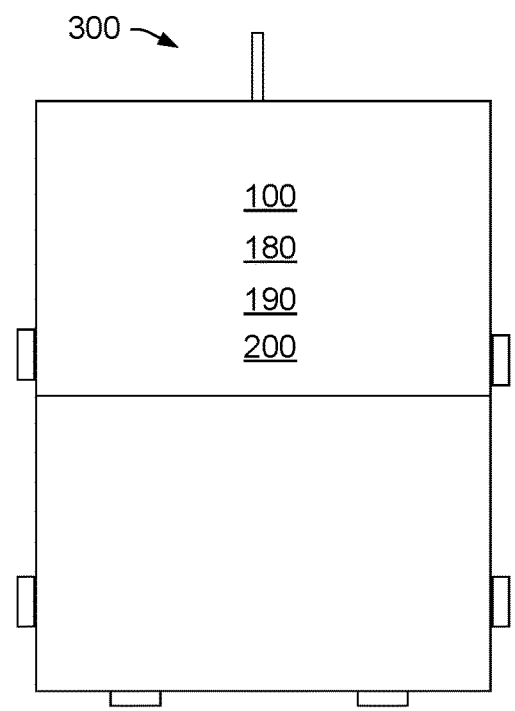
FIG. 6A, FIG. 6B, FIG. 6C and FIG. 6D are a series of diagrams of examples of adjustable computing device hangers and computing devices.

In FIG. 6A, the hanger 300 supports the device 100 while it is in the orientation 109 of FIG. 1, supports the device 180 while it is in the orientation 189 of FIG. 1, supports the device 190 in one or more orientations some of which are shown in FIG. 1, and supports the device 200 while it is in the orientation 201 of FIG. 2.

Figure 6B:
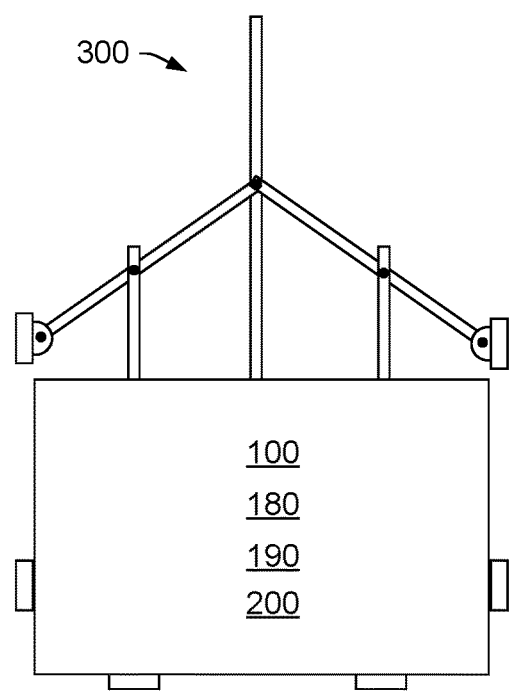

In FIG. 6B, the hanger 300 supports the device 100 while it is in the orientation 107 of FIG. 1, supports the device 180 while it is in the orientation 187 of FIG. 1, supports the device 190 in one or more orientations some of which are shown in FIG. 1, and supports the device 200 while it is in the orientation 203 of FIG. 2.

Figure 6C:
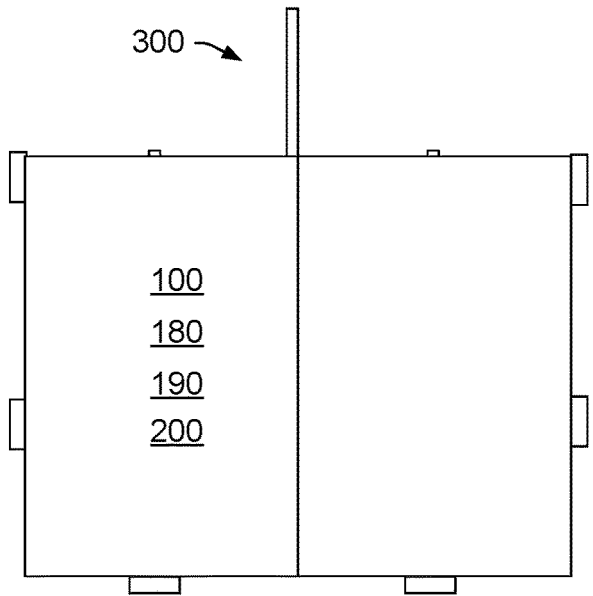

In FIG. 6C, the hanger 300 supports the device 100 while it is in the orientation 109 of FIG. 1, supports the device 180 while it is in the orientation 189 of FIG. 1, supports the device 190 in one or more orientations some of which are shown in FIG. 1, and supports the device 200 while it is in the orientation 201 of FIG. 2. As shown, the orientations in FIG. 6C can be rotated by 90 degrees compared to the orientations in FIG. 6A. For example, where a device includes a hinge assembly with an axis, the axis can be horizontal in FIG. 6A and the axis can be vertical in FIG. 6C.

Figure 6D:
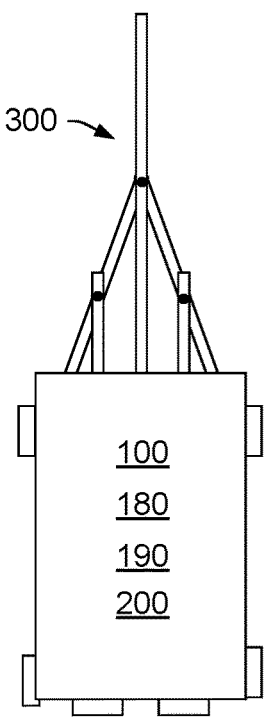

In FIG. 6D, the hanger 300 can support one or more types of devices where, for example, an orientation may be a portrait orientation and where an orientation of FIG. 6B may be a landscape orientation. As an example, in FIG. 6D, the orientation may correspond to that of a tablet device, a mobile cell phone device, etc.

In various examples members are shown as being of a particular width or widths. As an example, the member 310 may be wider than one or more other members. For example, the member 310 may be sufficiently wide to accommodate one or more features, such as, for example, a hole for hanging, a hook for hanging, etc. The mass of an assembly that includes the hanger 300 and a computing device may be carried by the member 310, which as shown, can be a central member.

As an example, widths of members may be relatively narrow such that a computing device air flow vent, speaker vent, etc., is not covered. For example, where a computing device includes vents on a back side of a housing, the members that may run along the back side of the housing may pose minimal risk of interfering with such vents or interfere with a minimal number of the vents. As an example, a member that is not the member 310 may be of a width of approximately 3 cm or less. For example, consider the member 310 being of a width that may be equal to or greater than 3 cm while other members may be less than approximately 3 cm. As shown in various examples, the member 310 may be lesser overlapping with a computing device than one or more other members. For example, consider FIG. 3 and FIG. 6A where the member 310 may not extend to the bumpers 363 and 365 such that a thicker member 310 may pose less of a risk of blocking one or more vents of a computing device while being sufficiently strong (e.g., via its width) to carry the mass of the computing device.

As an example, upon placing a computing device in the hanger 300, the hanger 300 may be self-adjusting under the mass of the computing device such that some amount of centering occurs. As an example, the bumpers or hooks 363 and 365 may provide for a relatively low coefficient of friction such that a sliding can occur such that a computing device becomes centered upon forces applied by the bumpers 323, 325, 343 and 345. For example, if the computing device is slightly to the right, forces applied to the computing device along right and left edges by the bumpers 323, 325, 343 and 345 may cause the computing device to be moved to the left. As an example, the grippiness, springiness, coefficient of friction, etc., of the bumpers may differ where the bumpers 363 and 365 provide for lesser grippiness, springiness and/or coefficient of friction compared to the bumpers 323, 325, 343 and 345 such that a computing device may be more readily centered. As to low friction material, consider polished material, a polymeric material such as, for example, polytetrafluoroethylene (PTFE), which is a synthetic fluoropolymer of tetrafluoroethylene. Such types of materials may have suitable wear characteristics (e.g., durability) while having a low coefficient of friction that can permit sliding.

As shown, the hanger 300 can include two angling members 322 and 324 and 342 and 344 to each side of the member 310. As an example, a hanger may include one or more additional angling members, which may include corresponding bumpers.

Figure 7A:
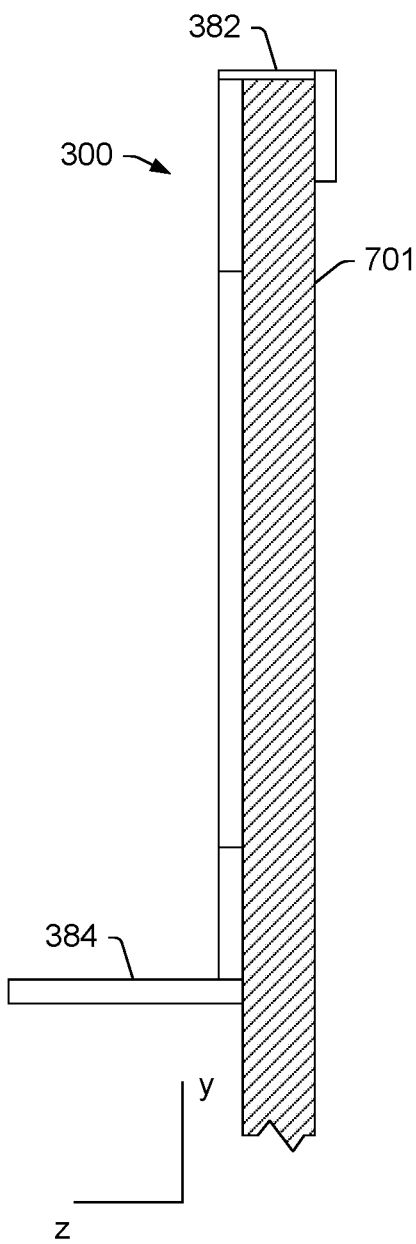
FIG. 7A and FIG. 7B are a series of diagrams of examples of adjustable computing device hangers.

FIG. 7A shows the hanger 300 as including an over the top hook 382 and another hook 384, which may be a shelf. In FIG. 7A, the hanger 300 is shown with respect to a vertical object 701, which may be a wall (e.g., a pony wall, a partition wall, etc.), a door, etc. As an example, the hook 384 (e.g., or shelf) may be suitable for supporting a power adapter such as, for example, an AC/DC power adapter (e.g., a power brick). In the example of FIG. 7A, one or more features of the hanger 300 may be described with respect to a coordinate system such as, for example, a Cartesian coordinate system with x, y, and z coordinates.

Figure 7B:
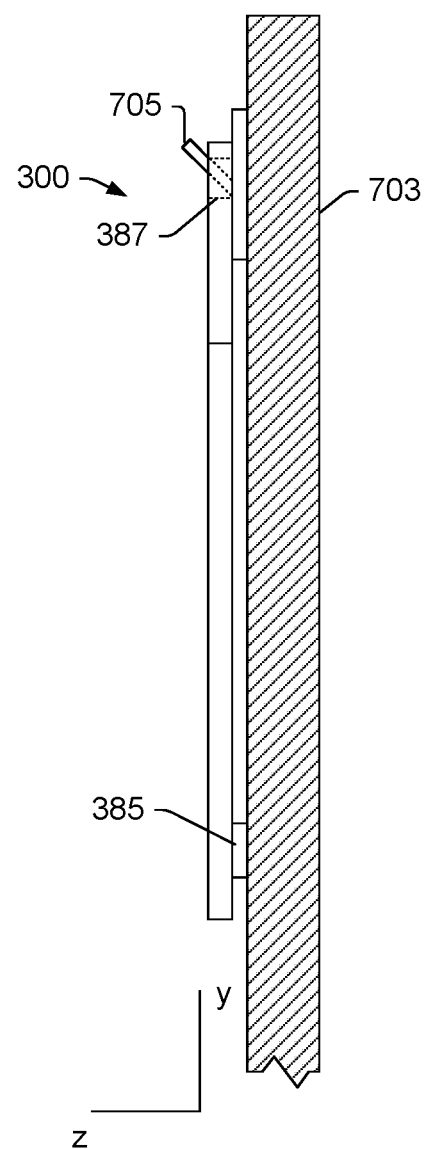

FIG. 7B shows the hanger 300 with respect to a vertical object 703 that includes a hook 705 where the hanger 300 can include an opening 387 that can receive the hook or another type of feature (e.g., a wire, a sawtooth component, etc.). As shown in FIG. 7B, the hanger 300 can include one or more pads that may be adjustable to contact a wall, etc., to help stabilize the hanger 300, with or without a computing device. In the example of FIG. 7B, the opening 387 can be in the member 310 such that the hook 705 mounted to the wall 701 or the vertical object 703 can be received at least in part by the opening 387 such that the hanger 300 can be supported on the wall 801 by itself and/or with a computing device. In the example of FIG. 7B, one or more features of the hanger 300 may be described with respect to a coordinate system such as, for example, a Cartesian coordinate system with x, y, and z coordinates.

Figure 8A:
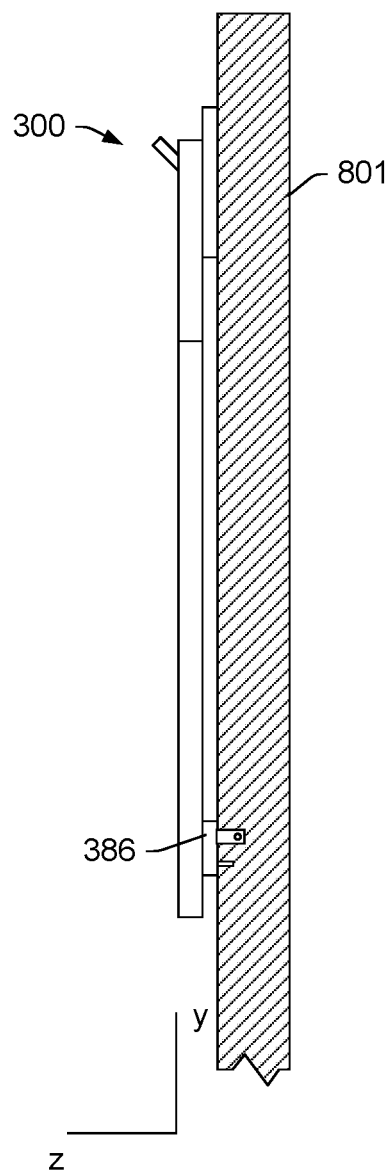
FIG. 8A and FIG. 8B are a series of diagrams of examples of adjustable computing device hangers.

FIG. 8A shows the hanger 300 with respect to a wall 801 where a power connector 386 may be adjustable to plug into a power outlet on the wall 801. For example, consider the power connector 386 as include a cord such that the power connector 386 can be positioned with respect to a power outlet. In such an example, the power connector 386 may be a USB connector, an AC connector or another type of connector. In the example of FIG. 8A, one or more features of the hanger 300 may be described with respect to a coordinate system such as, for example, a Cartesian coordinate system with x, y, and z coordinates.

Figure 8B:
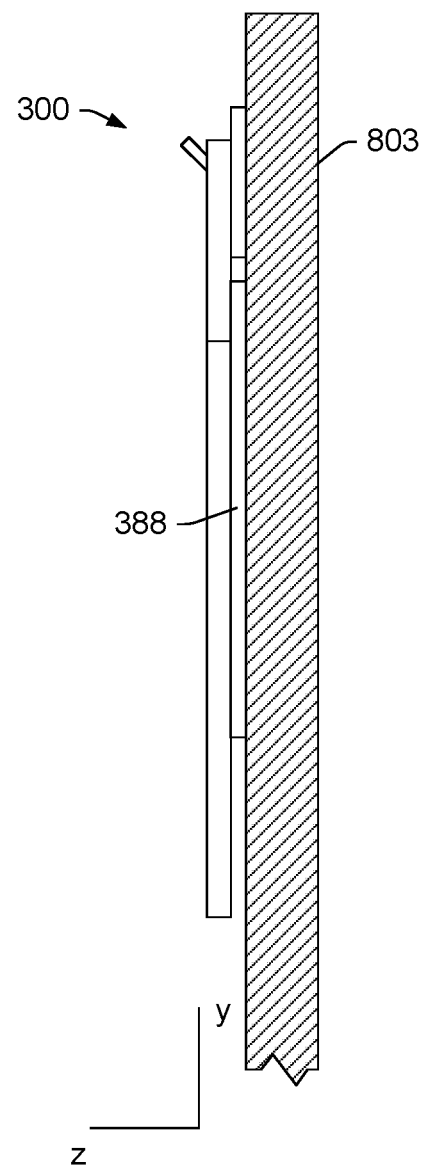

FIG. 8B shows the hanger 300 with respect to a wall 803 where the hanger 300 can include a battery 388, which may be a relatively slim battery. As an example, a battery may be a packaged battery with a casing where a thickness of the packaged battery may help space the hanger 300 with respect to the wall 803 or another object. Where the hanger 300 includes the battery 388, a USB or other type of connector may be included such that a computing device may receive power from the battery, which may allow for more flexibility in use as the hanger 300 and the computing device may be positioned at a location that may not include one or more power outlets. As an example, the battery 388 may be rechargeable via a USB type of connector or another type of connector. As an example, the battery 388 may be operatively coupled to wireless power transmission circuitry such as circuitry of the Qi standard. In such an example, a computing device supported by the hanger 300 may receive power wirelessly from the battery 388. In the example of FIG. 8B, one or more features of the hanger 300 may be described with respect to a coordinate system such as, for example, a Cartesian coordinate system with x, y, and z coordinates.

For sake of clarity, in FIGS. 7A and 7B and in FIGS. 8A and 8B, the bumpers are not illustrated, which may be positioned as appropriate depending on orientation of the hanger 300 (see, e.g., FIG. 3, FIG. 4, FIG. 5, FIGS. 6A, 6B, 6C and 6D, etc.).

Figure 9A:
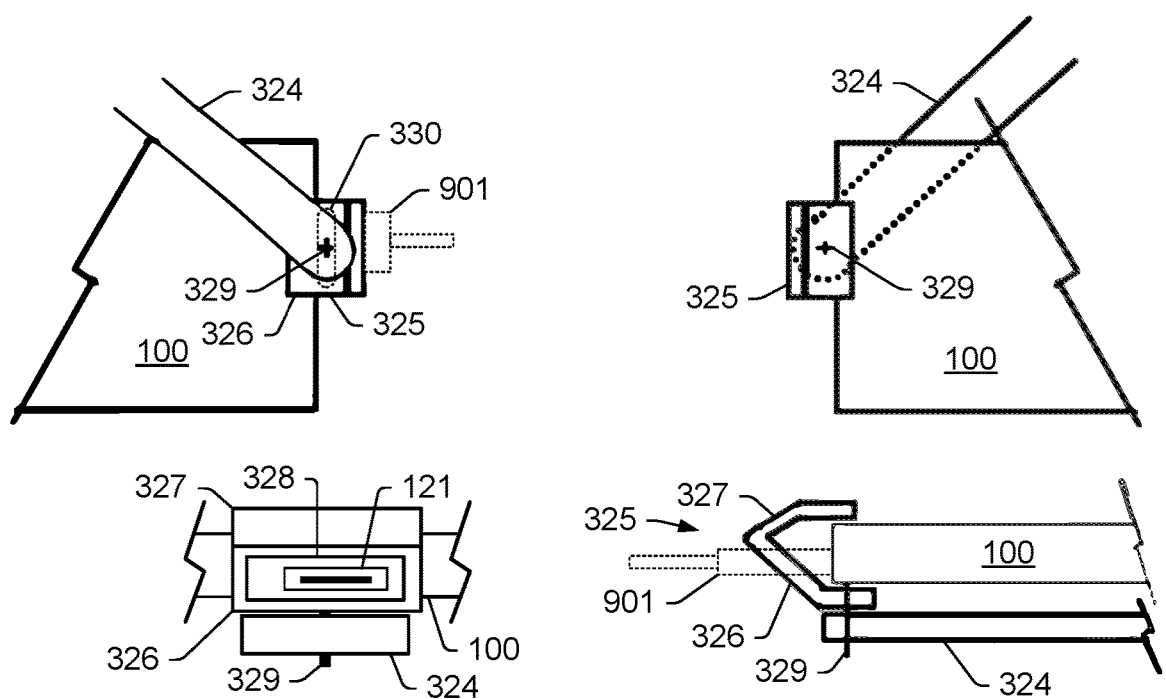
FIG. 9A and FIG. 9B are a series of diagrams of examples of features of an adjustable computing device hanger.

FIG. 9A shows an example of the hanger 300 where the member 324 is shown with respect to a computing device 100 where the bumper 325 is coupled to the member 324 via the pivot joint 329. As shown, the bumper 325 can include a rigid portion 326 and a resilient portion 327 where the resilient portion 327 can be elastically deformable to clip an edge of the computing device 100. As an example, a user may slide one edge into such clip bumpers and then use a finger to deform a clip bumper such that it can clip an edge. As an example, a portion of a hanger may be slidable such that a user may slide the portion of the hanger onto a computing device (e.g., consider sliding an edge into a clip bumper, etc. As shown in the example of FIG. 9A, the bumper 325 defines a channel that can receive the edge where the bumper 325 may apply a spring like force to help secure the computing device 100 in the hanger 300.

As explained, a bumper may include an opening where such an opening may provide for access to a side port of a computing device (e.g., a USB port, a SD card port, an audio input or output port, etc.). As an example, the rigid portion 326 of the bumper 325 may include an opening or openings 328 such that it can allow for access to a side (e.g., a side edge) port or ports 121 of the computing device 100. For example, see a dotted representation of a connector 901 that may be connected to a port of the computing device 100. As an example, a bumper may be of a vertical length that is larger than a USB connector where the bumper includes an opening that can receive a USB connector therethrough such that the USB connector can connect to a port of a computing device when the computing device is in a hanger that includes the bumper. As an example, an opening may be of a sufficient size to receive a USB type of connector (e.g., USB-A, USB-C, etc.).

As an example, a bumper may be translatable on a pivot joint. For example, consider the bumper 325 being translatable up or down on the pivot joint 329 via a slot 330. In such an example, if a port of the computing device 100 is blocked, the bumper 325 may be translated a distance upward or downward in an effort to reposition the bumper 325 such that the port is accessible. For example, consider the rigid portion 326 as including the slot 330 as a vertical slot such that the bumper 325 can be slide up or down to provide for access to a port and/or one or more other features of the computing device 100 (see, e.g., the example ports 221 and 241 of FIG. 2, the example port 121 of FIG. 9A, etc.). As an example, a member may include a slot where a bumper includes a pin. For example, consider the member 324 as including a slot such as the slot 330 where the pin 329 is coupled to the bumper 325 and translatable in the slot. In such an example, the pin 329 may allow for translation and rotation of the bumper 325.

Figure 9B:
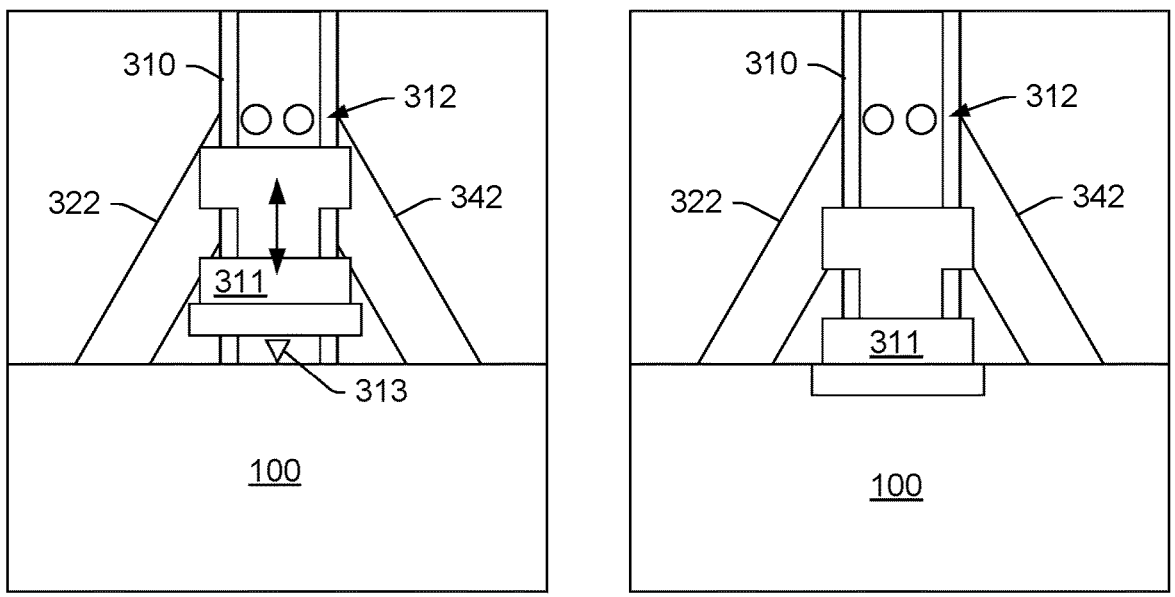

FIG. 9B shows an example of a top bumper 311 (e.g., a top edge bumper) that may be translatable on the member 310, which may include a centering indicium 313. As shown, the members 310, 322 and 342 can be joined via one or more pivot joints 312. As an example, the member 310 can include a slot or slots that can receive a portion of the top bumper 311 such that the top bumper 311 may be a retained part of the hanger 300 (e.g., not come of, get lost, etc.). As shown in FIG. 9B, the top bumper 311 may be translated downwardly such that it helps to secure an upper edge of the computing device 100. As explained with respect to the example of FIG. 6C, a hinge assembly axis may be vertical. In such an example, the top bumper 311 may be suitable for contact or otherwise securing multiple housings (e.g., one housing to one side of the hinge assembly axis and one housing to the other side of the hinge assembly axis, etc.). As an example, the top bumper 311 may be at least partially elastically deformable, for example, akin to the bumper 325 of FIG. 9A.

As an example, a bumper or a hook may be made of one or more materials. As an example, a bumper or a hook may be rubberized with a polymeric coating over a polymeric core, a metallic core, etc. As an example, a portion of a bumper or a hook can be rigid and another portion resilient to act like a spring, which may facilitate clamping a computing device.

Figure 10:
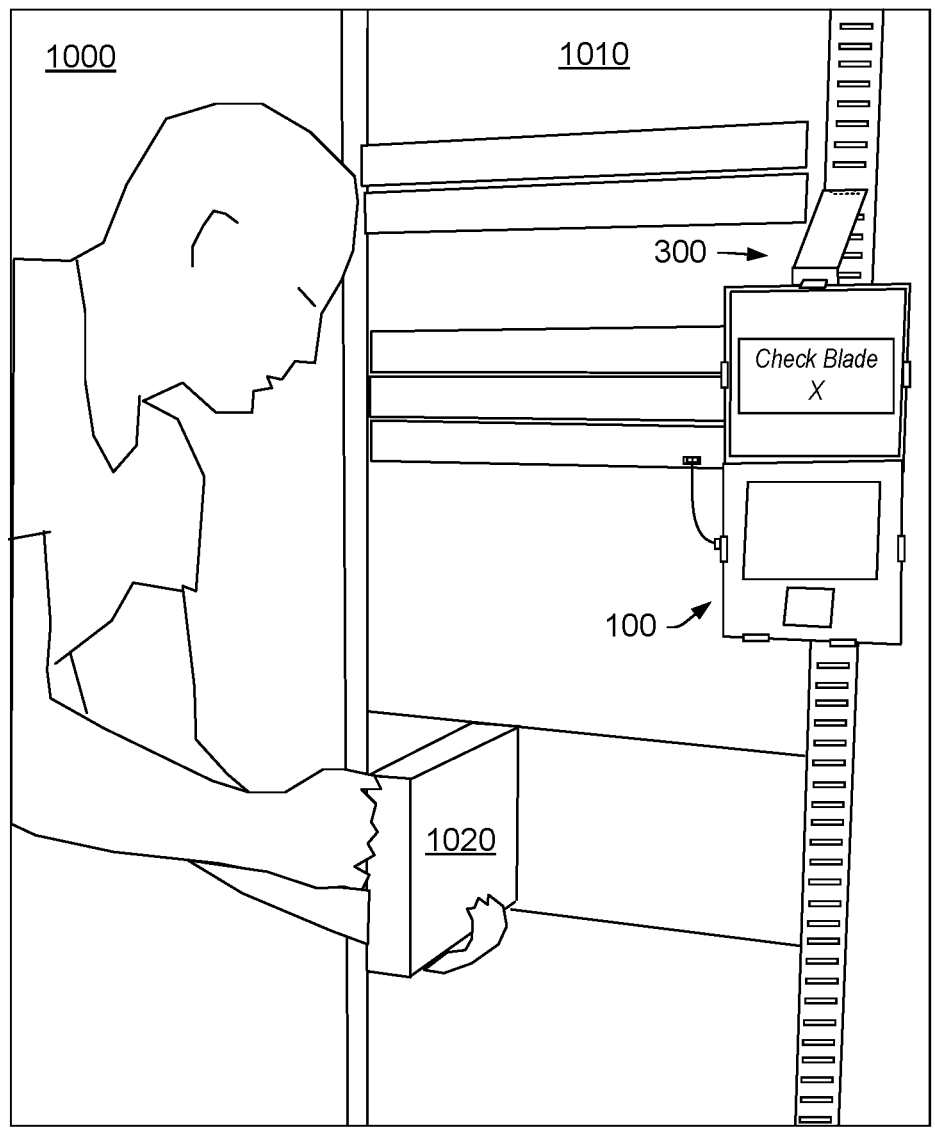
FIG. 10 is a diagram of an example of a scenario that includes an example of an adjustable computing device hanger.

FIG. 10 shows an example of a scenario 1000 where the hanger 300 is supporting the device 100 on a server rack 1010 where, for example, a service provider may see information rendered to a display of the device 100 and perform service accordingly, such as, for example, servicing a component 1020 (e.g., "blade X"). In the example of FIG. 10, the hanger 300 can include a hook that may engage a slot in the server rack 1010 and, for example, the hanger 300 may include a spacer that can contact the server rack 1010 to space at least a portion of the hanger 300 a distance from the server rack 1010. For example, the member 310 may include a hinge such that a portion of the member 310 can fold back to couple to the server rack 1010 where a spacer that may be coupled to a lower portion of the member 310 may be adjustable to contact the server rack 1010. In such an example, the hanger 300 may be readily supported on the server rack 1010 and space the device 100 an appropriate distance such that it clears various equipment disposed in the server rack 1010, which may extend a distance in front of an upright of the server rack 1010. As an example, a server rack upright may include a series of features arranged along its height such that the hanger 300 may be positioned at a desirable height, which may be proximate to one or more pieces of equipment (e.g., servers, etc.) where the device 100 may provide information, analysis, etc., for helping to service one or more of the pieces of equipment. As an example, a cable may be utilized to couple the device 100 and equipment (e.g., a server, etc.).

As an example, an adjustable computing device hanger can include a hangable support member; a first set of angling side members, pivotably coupled to the hangable support member, that include first side edge bumpers, and a second set of angling side members, pivotably coupled to the hangable support member, that include second side edge bumpers; and a first guide member that bridges the first set of the angling side members and a second guide member that bridges the second set of angling side members, where each of the first guide member and the second guide member includes a corresponding bottom edge bumper.

As an example, an adjustable computing device hanger can include a hangable spine; left arms, pivotably coupled to the hangable spine, that include left side clamps, and right arms, pivotably coupled to the hangable spine, that include right side clamps; and a left leg that bridges the left arms and a right leg that bridges the right arms, where each of the left leg and the right leg includes a corresponding hook.

As an example, a hanger can include an adjustable top edge bumper operatively coupled to a hangable support member. As an example, a hangable support member, a first guide member and a second guide member can be substantially parallel. As an example, angling side members of a first set of angling side members can be substantially parallel and angling side members of a second set of angling side members can be substantially parallel. As an example, substantially parallel can be plus or minus approximately 10 degrees.

As an example, a hangable support member can include couplings for the first set of angling side members and the second set of angling side members. For example, couplings may be pivotable joints. For example, a pivotable joint can include a pin or a bushing received in a bore where the pivotable joint physically joins two or more members. As an example, a joint can be a rivet type of joint that allows for movement of one component with respect to another component.

As an example, joints of a hanger can include an amount of friction such that, for example, a user may adjust the hanger to an approximate size where the hanger can maintain that size under its own weight (e.g., mass) when hanging. For example, consider a user manually adjusting a hanger to a size where various joints include an amount of friction or other force that can maintain the hanger in the adjusted size. In such an example, the user may manually pick up a computing device and then rest it on the bumpers (e.g., hooks, etc.) at the bottom of the hanger. Under the weight of the computing device, the hanger can then overcome the amount of friction or other force to snuggly secure the computing device, for example, via movement of one or more members. As mentioned, in such an approach, some amount of centering movement may occur.

As an example, a hanger may be relatively light weight compared to a computing device. For example, consider a hanger that has a mass that is less than approximately 1 kg. In such an example, the joints of the hanger may be able to maintain the hanger when hung on a vertical wall, door, server rack, etc., such that a user can safely maneuver her computing device into the hanger, where, as mentioned, the mass of the computing device in combination with the mass of the hanger may cause the hanger to snuggly secure the computing device. As an example, a hanger may have a mass that is less than approximately 0.5 kg, which may make it more readily transportable as well as suitable for a computing device that has a mass greater than 0.5 kg.

In various instances, weight may be given as force using the equation $F=ma$, where acceleration may be the acceleration of gravity (e.g., $F=mg$), which may be approximated as 9.8 m/s$^2$. In such instances, one or more force balances may be made for a hanger and/or a computing device where joints may optionally be adjustable as to friction, etc. (e.g., akin to a friction hinge that may include a nut or other mechanism that can be tightened or loosened to achieve a desired amount of friction). As an example, one or more joints of a hanger can include threaded components where, for example, a nut may be rotated on an axle to cause components to experience increased frictional force that may resist moving. As an example, once a computing device is fit into a hanger, a hanger may include one or more locking mechanisms that act to secure the computing device. For example, consider one or more joints that can be adjusted as to frictional force and/or a top bumper that may be secured, for example, using a thumb screw or other locking mechanism. For example, in FIG. 9B, the top bumper may be fit with a thumb screw that can be turned by hand to assure that the top bumper does not move.

As an example, a first guide member that bridges a first set of angling side members can operatively couple the first set of angling side members for synchronous movement and, for example, a second guide member that bridges a second set of angling side members can operatively couples the second set of angling side members for synchronous movement.

As an example, a first set of angling side members and a first guide member can be movable independent of a second set of angling side members and second guide member.

As an example, a hangable support member can include a centering indicium for centering of a computing device. As an example, a sliding top bumper may include a marker that can provide for centering of a computing device.

As an example, a hanger can include first side edge bumpers that are adjustably coupled to a corresponding one of a first set of angling side members, where each of second side edge bumpers are adjustably coupled to a corresponding one of a second set of angling side members. In such an example, adjustable couplings can provide for pivoting (e.g., pivotably coupled) and/or can provide for translating (e.g., translatably coupled for translation to allow for access to one or more ports of a computing device, etc.).

As an example, a hanger can include first side edge bumpers that are pivotably coupled to a corresponding one of a first set of angling side members, where each of second side edge bumpers are pivotably coupled to a corresponding one of a second set of angling side members. As an example, each of first side edge bumpers and each of second side edge bumpers can include a channel. In such an example, the channel may be an adjustable width channel.

As an example, at least one bumper can include a connector opening for passage of a connector to a port of a computing device. As an example, at least one bumper can be adjustable up or down. As an example, a bumper may be adjustable up or down and include at least one opening, which may be an edge opening (e.g., with an open perimeter) or an enclosed opening (e.g., with an enclosed perimeter). Such an approach may provide for access to a port or ports of a computing device by a connector (e.g., a USB connector, an audio connector, a power connector, etc.). As an example, a hanger can include one or more of a cable guide, a battery, and at least one of a power socket and a power plug.

As an example, a first distance between first edge bumpers and second edge bumpers of a hanger can define a width that matches a width of a computing device. As an example, a second distance between first edge bumpers and second edge bumpers of a hanger can define a width that matches a length of the computing device. In such an example, the length can correspond to a sum of a length of a first housing and a length of a second housing of a computing device, where a hinge axis of a hinge assembly that couples the first housing and the second housing is alignable with a hangable support member of the hanger.

As an example, an assembly can include an adjustable computing device hanger that includes a hangable support member; a first set of angling side members, pivotably coupled to the support member, that include first side edge bumpers and a second set of angling side members, pivotably coupled to the support member, that include second side edge bumpers; and a first guide member that bridges the first set of the angling side members and a second guide member that bridges the second set of angling side members, where each of the first guide member and the second guide member includes a corresponding bottom edge bumper; and a computing device secured by the adjustable computing device hanger between the first side edge bumpers and the second side edge bumpers. In such an example, the computing device can be supported by the bottom edge bumpers.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium.

Figure 11:
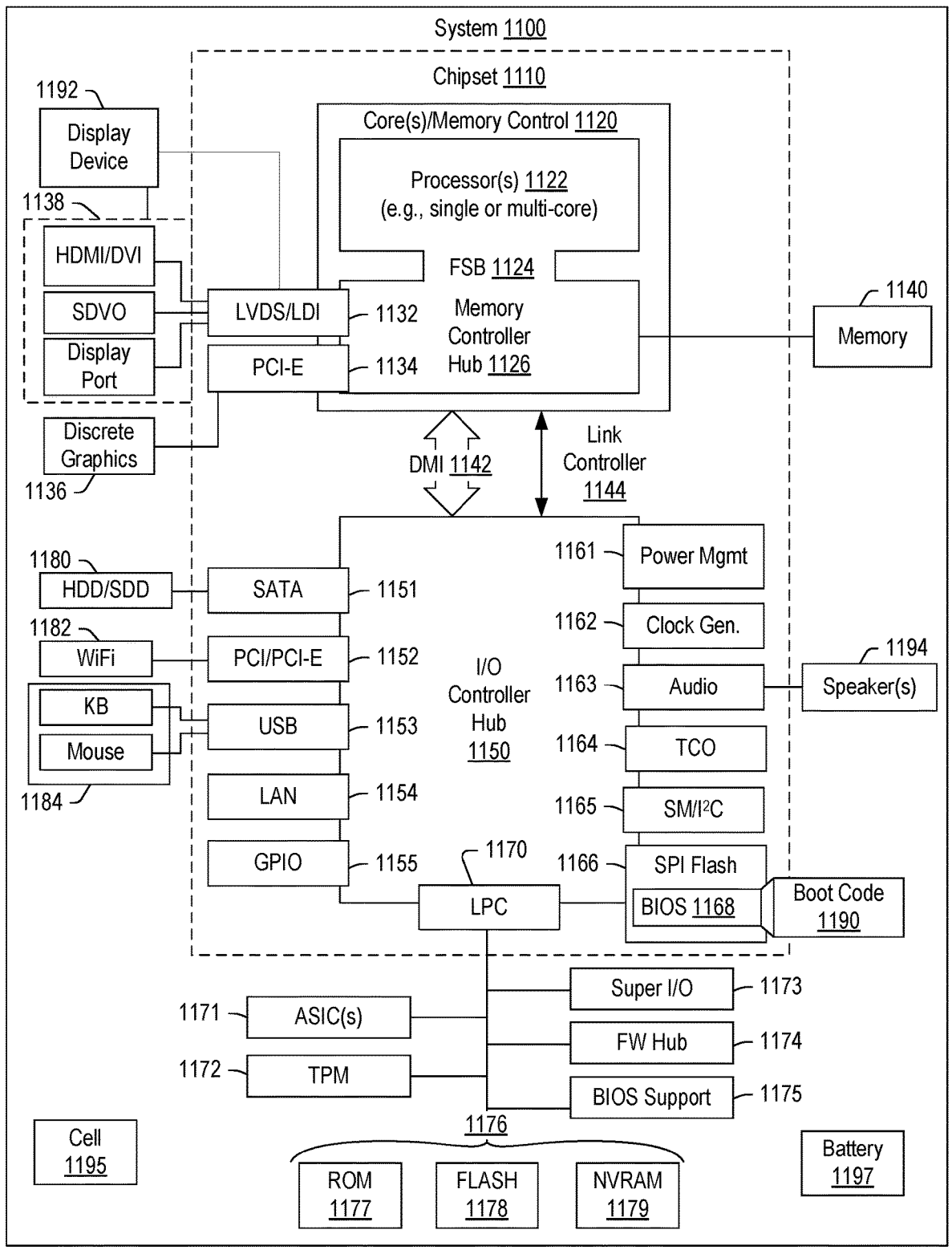
FIG. 11 is a diagram of an example of a system.

While various examples of circuits or circuitry have been discussed, FIG. 11 depicts a block diagram of an illustrative computer system 1100. The system 1100 may be a desktop computer system, such as one of the THINKCENTRE® or THINKPAD® series of personal computers sold by Lenovo (US) Inc. of Morrisville, N.C., or a workstation computer, such as the THINKSTATION®, which are sold by Lenovo (US) Inc. of Morrisville, N.C.; however, as apparent from the description herein, a computing device, a display device or other machine may include other features or only some of the features of the system 1100. As an example, the computing device 100 and/or the computing device 200 may include various features of the system 1100.

As shown in FIG. 11, the system 1100 includes a so-called chipset 1110. A chipset refers to a group of integrated circuits, or chips, that are designed to work together. Chipsets are usually marketed as a single product (e.g., consider chipsets marketed under the brands INTEL®, AMD®, etc.).

In the example of FIG. 11, the chipset 1110 has a particular architecture, which may vary to some extent depending on brand or manufacturer. The architecture of the chipset 1110 includes a core and memory control group 1120 and an I/O controller hub 1150 that exchange information (e.g., data, signals, commands, etc.) via, for example, a direct management interface or direct media interface (DMI) 1142 or a link controller 1144. In the example of FIG. 11, the DMI 1142 is a chip-to-chip interface (sometimes referred to as being a link between a "northbridge" and a "southbridge").

The core and memory control group 1120 include one or more processors 1122 (e.g., single core or multi-core) and a memory controller hub 1126 that exchange information via a front side bus (FSB) 1124. As described herein, various components of the core and memory control group 1120 may be integrated onto a single processor die, for example, to make a chip that supplants the conventional "northbridge" style architecture.

The memory controller hub 1126 interfaces with memory 1140. For example, the memory controller hub 1126 may provide support for DDR SDRAM memory (e.g., DDR, DDR2, DDR3, etc.). In general, the memory 1140 is a type of random-access memory (RAM). It is often referred to as "system memory".

The memory controller hub 1126 further includes a low-voltage differential signaling interface (LVDS) 1132. The LVDS 1132 may be a so-called LVDS Display Interface (LDI) for support of a display device 1192 (e.g., a CRT, a flat panel, a projector, etc.). A block 1138 includes some examples of technologies that may be supported via the LVDS interface 1132 (e.g., serial digital video, HDMI/DVI, display port). The memory controller hub 1126 also includes one or more PCI-express interfaces (PCI-E) 1134, for example, for support of discrete graphics 1136. Discrete graphics using a PCI-E interface has become an alternative approach to an accelerated graphics port (AGP). For example, the memory controller hub 1126 may include a 16-lane (×16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 1150 includes a variety of interfaces. The example of FIG. 11 includes a SATA interface 1151, one or more PCI-E interfaces 1152 (optionally one or more legacy PCI interfaces), one or more USB interfaces 1153, a LAN interface 1154 (more generally a network interface), a general purpose I/O interface (GPIO) 1155, a low-pin count (LPC) interface 1170, a power management interface 1161, a clock generator interface 1162, an audio interface 1163 (e.g., for speakers 1194), a total cost of operation (TCO) interface 1164, a system management bus interface (e.g., a multi-master serial computer bus interface) 1165, and a serial peripheral flash memory/controller interface (SPI Flash) 1166, which, in the example of FIG. 11, includes BIOS 1168 and boot code 1190. With respect to network connections, the I/O hub controller 1150 may include integrated gigabit Ethernet controller lines multiplexed with a PCI-E interface port. Other network features may operate independent of a PCI-E interface.

The interfaces of the I/O hub controller 1150 provide for communication with various devices, networks, etc. For example, the SATA interface 1151 provides for reading, writing or reading and writing information on one or more drives 1180 such as HDDs, SDDs or a combination thereof. The I/O hub controller 1150 may also include an advanced host controller interface (AHCI) to support one or more drives 1180. The PCI-E interface 1152 allows for wireless connections 1182 to devices, networks, etc. The USB interface 1153 provides for input devices 1184 such as keyboards (KB), one or more optical sensors, mice and various other devices (e.g., microphones, cameras, phones, storage, media players, etc.). On or more other types of sensors may optionally rely on the USB interface 1153 or another interface (e.g., I²C, etc.). As to microphones, the system 1100 of FIG. 11 may include hardware (e.g., audio card) appropriately configured for receipt of sound (e.g., user voice, ambient sound, etc.).

In the example of FIG. 11, the LPC interface 1170 provides for use of one or more ASICs 1171, a trusted platform module (TPM) 1172, a super I/O 1173, a firmware hub 1174, BIOS support 1175 as well as various types of memory 1176 such as ROM 1177, Flash 1178, and non-volatile RAM (NVRAM) 1179. With respect to the TPM 1172, this module may be in the form of a chip that can be used to authenticate software and hardware devices. For example, a TPM may be capable of performing platform authentication and may be used to verify that a system seeking access is the expected system.

The system 1100, upon power on, may be configured to execute boot code 1190 for the BIOS 1168, as stored within the SPI Flash 1166, and thereafter processes data under the control of one or more operating systems and application software (e.g., stored in system memory 1140). An operating system may be stored in any of a variety of locations and accessed, for example, according to instructions of the BIOS 1168. Again, as described herein, a satellite, a base, a server or other machine may include fewer or more features than shown in the system 1100 of FIG. 11. Further, the system 1100 of FIG. 11 is shown as optionally include cell phone circuitry 1195, which may include GSM, CDMA, etc., types of circuitry configured for coordinated operation with one or more of the other features of the system 1100.

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. An adjustable computing device hanger comprising:
   a hangable support member;
   a first set of angling side members, pivotably coupled to the hangable support member, that comprise first side edge bumpers, and a second set of angling side members, pivotably coupled to the hangable support member, that comprise second side edge bumpers; and
   a first guide member that bridges the first set of the angling side members and a second guide member that bridges the second set of angling side members, wherein each of the first guide member and the second guide member comprises a corresponding bottom edge bumper.

2. The adjustable computing device hanger of claim 1, comprising an adjustable top edge bumper operatively coupled to the hangable support member.

3. The adjustable computing device hanger of claim 1, wherein the hangable support member, the first guide member and the second guide member are substantially parallel.

4. The adjustable computing device hanger of claim 1, wherein angling side members of the first set of the angling side members are substantially parallel and wherein the angling side members of the second set of the angling side members are substantially parallel.

5. The adjustable computing device hanger of claim 1, wherein the hangable support member comprises couplings for the first set of the angling side members and the second set of the angling side members.

6. The adjustable computing device hanger of claim 1, wherein the first guide member that bridges the first set of the angling side members operatively couples the first set of the angling side members for synchronous movement.

7. The adjustable computing device hanger of claim 1, wherein the second guide member that bridges the second set of the angling side members operatively couples the second set of the angling side members for synchronous movement.

8. The adjustable computing device hanger of claim 1, wherein the first set of the angling side members and the first guide member are movable synchronously and independent of the second set of the angling side members and the second guide member.

9. The adjustable computing device hanger of claim 1, wherein the hangable support member comprises a centering indicium for centering of a computing device.

10. The adjustable computing device hanger of claim 1, wherein each of the first side edge bumpers are adjustably coupled to a corresponding one of the first set of the angling side members and wherein each of the second side edge bumpers are adjustably coupled to a corresponding one of the second set of the angling side members.

11. The adjustable computing device hanger of claim 1, wherein each of the first side edge bumpers and each of the second side edge bumpers comprises an adjustable width channel.

12. The adjustable computing device hanger of claim 1, wherein at least one of the bumpers comprises a connector opening for passage of a connector to a port of a computing device.

13. The adjustable computing device hanger of claim 1, comprising a cable guide.

14. The adjustable computing device hanger of claim 1, comprising a battery.

15. The adjustable computing device hanger of claim 1, comprising at least one of a power socket and a power plug.

16. The adjustable computing device hanger of claim 1, wherein a first distance between the first edge bumpers and the second edge bumpers defines a width that matches a width of a computing device.

17. The adjustable computing device hanger of claim 16, wherein a second distance between the first edge bumpers and the second edge bumpers defines a width that matches a length of the computing device.

18. The adjustable computing device hanger of claim 17, wherein the length corresponds to a sum of a length of a first housing and a length of a second housing of a computing device, wherein a hinge axis of a hinge assembly that couples the first housing and the second housing is alignable with the hangable support member.

19. An assembly comprising:

an adjustable computing device hanger that comprises a hangable support member; a first set of angling side members, pivotably coupled to the support member, that comprise first side edge bumpers and a second set of angling side members, pivotably coupled to the support member, that comprise second side edge bumpers; and a first guide member that bridges the first set of the angling side members and a second guide member that bridges the second set of angling side members, wherein each of the first guide member and the second guide member comprises a corresponding bottom edge bumper; and a computing device secured by the adjustable computing device hanger between the first side edge bumpers and the second side edge bumpers.

20. The assembly of claim 19, wherein the computing device is supported by the bottom edge bumpers.

\* \* \* \* \*